United States Patent
Mendiola

[19]

[11] Patent Number: 6,039,187

[45] Date of Patent: *Mar. 21, 2000

[54] OFF CENTER THREE POINT CARRIER FOR WET PROCESSING SEMICONDUCTOR SUBSTRATES

[75] Inventor: Jeff Mendiola, Meridian, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/135,361

[22] Filed: Aug. 17, 1998

[51] Int. Cl.[7] .................................................. B65D 25/04
[52] U.S. Cl. ............................................ 206/711; 206/454
[58] Field of Search .................................. 206/710, 711, 206/712, 454, 456

[56] References Cited

U.S. PATENT DOCUMENTS

| | | |
|---|---|---|
| 4,653,636 | 3/1987 | Armstrong ............................... 206/711 |
| 5,111,936 | 5/1992 | Kos . |
| 5,429,251 | 7/1995 | Mathews . |
| 5,503,173 | 4/1996 | Kudo et al. .......................... 206/711 X |

*Primary Examiner*—Jacob K. Ackun
*Attorney, Agent, or Firm*—Dickstein Shapiro Morin & Oshinsky LLP

[57] ABSTRACT

An off center three point carrier to be used in the wet processing of semiconductor substrates is provided. The carrier includes two side rails positioned in a spaced parallel relation by a plurality of supports. A third side rail is placed on the supports at an off center position relative to the first two side rails. The three spaced rails define a receiving region for one or more semiconductor substrates. By placing the third side rail in an off center position, etchants used in wafer processing will properly drain away from the semiconductor substrates when the carrier is removed from an etching bath. Thus, etchants are prevented from collecting within the rails of the carrier ensuring proper etching and drying of the semiconductor substrates.

33 Claims, 6 Drawing Sheets

OFF CENTER THREE POINT CARRIER FOR WET PROCESSING SEMICONDUCTOR SUBSTRATES

BACKGROUND OF THE INVENTION

1. Field of the Invention

This invention relates to the field of semiconductor manufacturing and, in particular, to an off center three point carrier for wet processing semiconductor substrates.

2. Description of the Related Art

Semiconductor wafer carriers, also referred to as semiconductor wafer cassettes, are known in the art. Such carriers are typically utilized for storage, transportation and processing of semiconductor substrates used in the fabrication of semiconductor devices. A typical example of such a semiconductor substrate is a semiconductor wafer. For purposes of illustration only, a semiconductor wafer will be used as the semiconductor substrate. The semiconductor wafer carriers are configured to carry a plurality of semiconductor wafers. In particular, the semiconductor wafer carriers usually include a plurality of slots configured to receive a single semiconductor wafer.

Typically, the semiconductor wafers are arranged within the wafer carrier outside of a semiconductor processor. The wafer carrier is thereafter transported, with the wafers inside, into the processing apparatus, for example, an etching bath, which are typically configured to process the wafers within the carrier.

Figure 1:
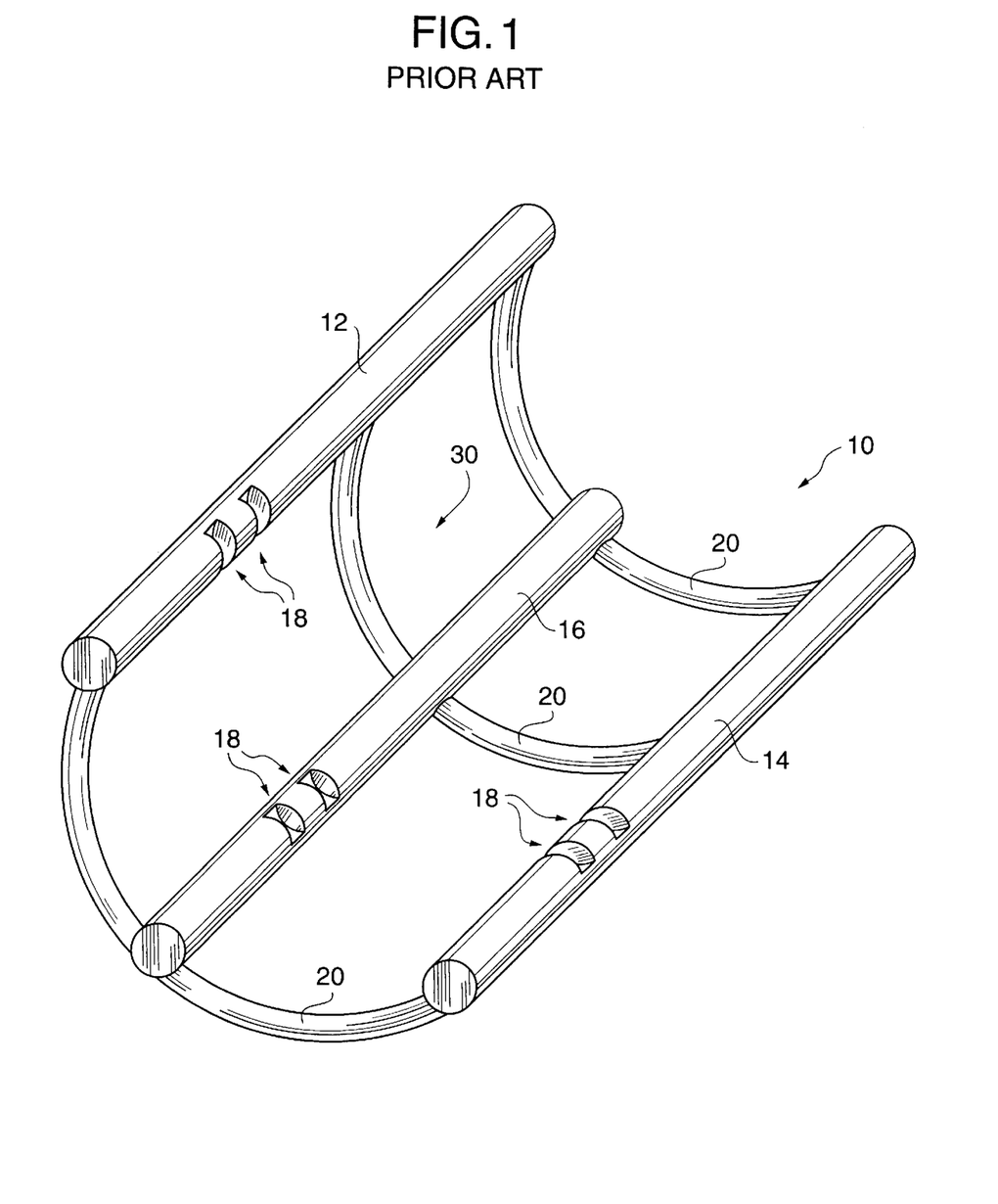
FIG. 1 is an isometric view of a conventional three point wafer carrier.
Figure 2:
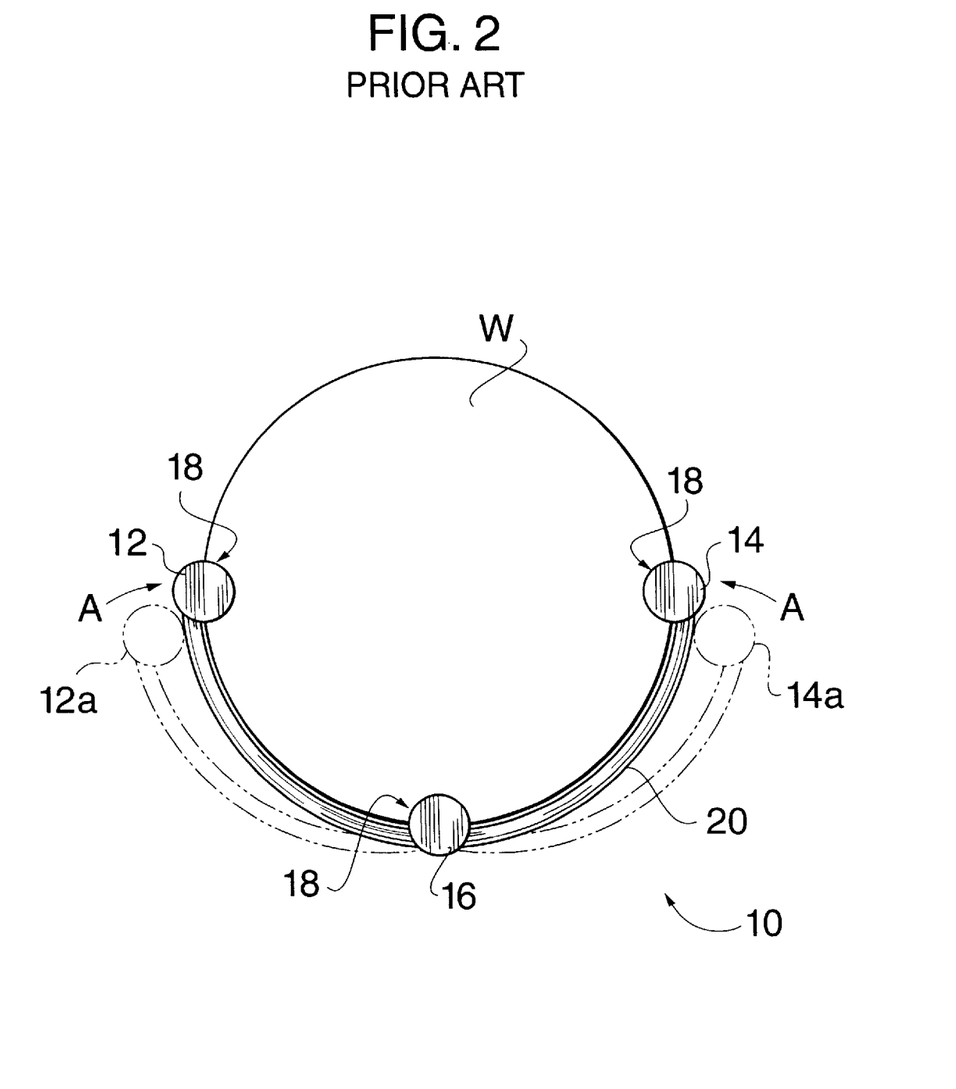
FIG. 2 is a front view of a conventional three point wafer carrier.

FIGS. 1 and 2 illustrate a conventional three point wafer carrier 10 used in the processing of semiconductor wafers W. The carrier 10 includes first and second side rails 12, 14 and a bottom rail 16. The first and second side rails 12, 14, are positioned in a spaced parallel relation by U-shaped or V-shaped supports 20. The bottom rail 16 is positioned on the supports 20 at a point that is equidistant between the two side rails 12, 14 at the lowest and most centralized position of the supports 20. The three rails 12, 14, 16 define a wafer receiving portion 30 where the wafers W are to be placed. Each of the rails 12, 14, 16 are provided with a series of equally spaced slots 18, sized and aligned to support a plurality of wafers W in a spaced, parallel relation. The series of slots 18 extend to the ends of the rails 12, 14, 16. Accordingly, wafers W placed within the slots 18 have three points of contact with the carrier 10.

Typically, the supports 20 are made out of a flexible material, such as TEFLON (synthetic resinous fluorine). The carrier 10 is designed such that when wafers W are placed within the carrier 10, the weight of the wafers W applied onto the bottom rail 16 causes the supports 20 to move in the direction illustrated by the arrow A. As the supports 20 move, the first and second side rails 12, 14 also move (the original positions of the rails 12, 14 are illustrated in phantom as reference numerals 12a, 14a) producing a tension proportional to the total weight of all of the wafers W within the carrier 10. The tension maintains the wafers W in place within the carrier 10. The carrier 10 is placed into a semiconductor processor where, for example, etching of the wafers W occurs.

Although the conventional carrier 10 works well, it has a few shortcomings. For example, during wet etching of the wafers W, the etchant material has a tendency to gravitate in the slots 18 of the bottom rail 16. Thus, even after removing the carrier 10 from the semiconductor processor, etchant is still in contact with the wafers W. This condition can cause the etching of the wafer W to continue. There will be poor etching and drying in these areas. In addition, the wafers W may also become stained at these areas. Portions of the etched wafers W at these areas may become unusable. Therefore, there is a need and desire to prevent wet etchant or acids from collecting within the rails of a three point wafer carrier to ensure the proper etching and drying of semiconductor wafers.

BRIEF SUMMARY OF THE INVENTION

The present invention provides a semiconductor substrate carrier that prevents wet etchant or acids from collecting within the rails of the carrier to ensure proper etching and drying of semiconductor substrates such as a wafer.

The above features and advantages are achieved by providing an off center three point carrier to be used in the wet processing of semiconductor substrates. The carrier includes two side rails positioned in a spaced parallel relation by a plurality of supports. A third side rail is placed on the supports at an off center position relative to the first two side rails defining a receiving region for a semiconductor substrate. By placing the third side rail in an off center position, etchants will properly drain from the semiconductor substrates being etched and out of the carrier's rails when the wafer carrier is removed from an etching bath. Thus, etchants are prevented from collecting within the rails of the carrier ensuring proper etching and drying of the semiconductor substrates.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 3:
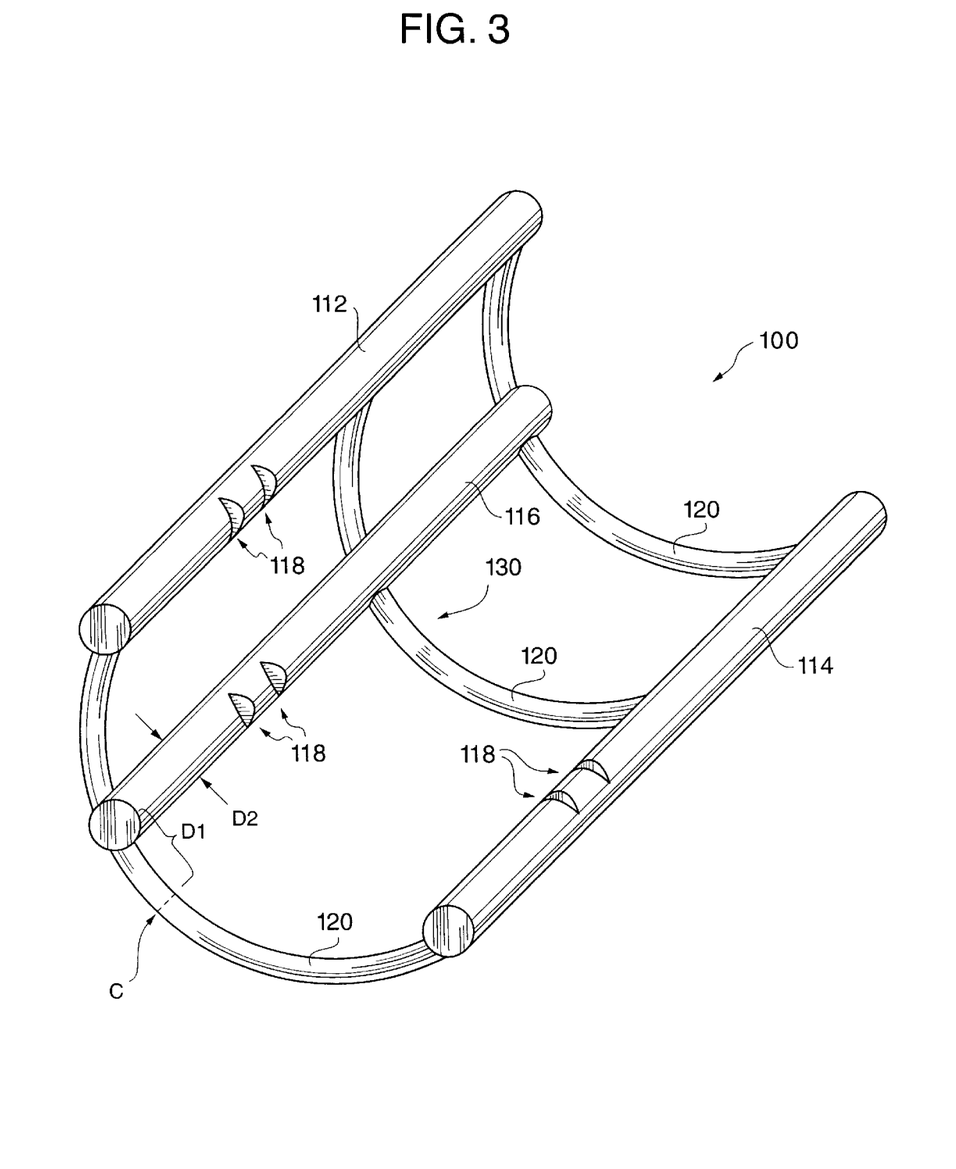
FIG. 3 is an isometric view of a three point wafer carrier constructed in accordance with the present invention.
Figure 4:
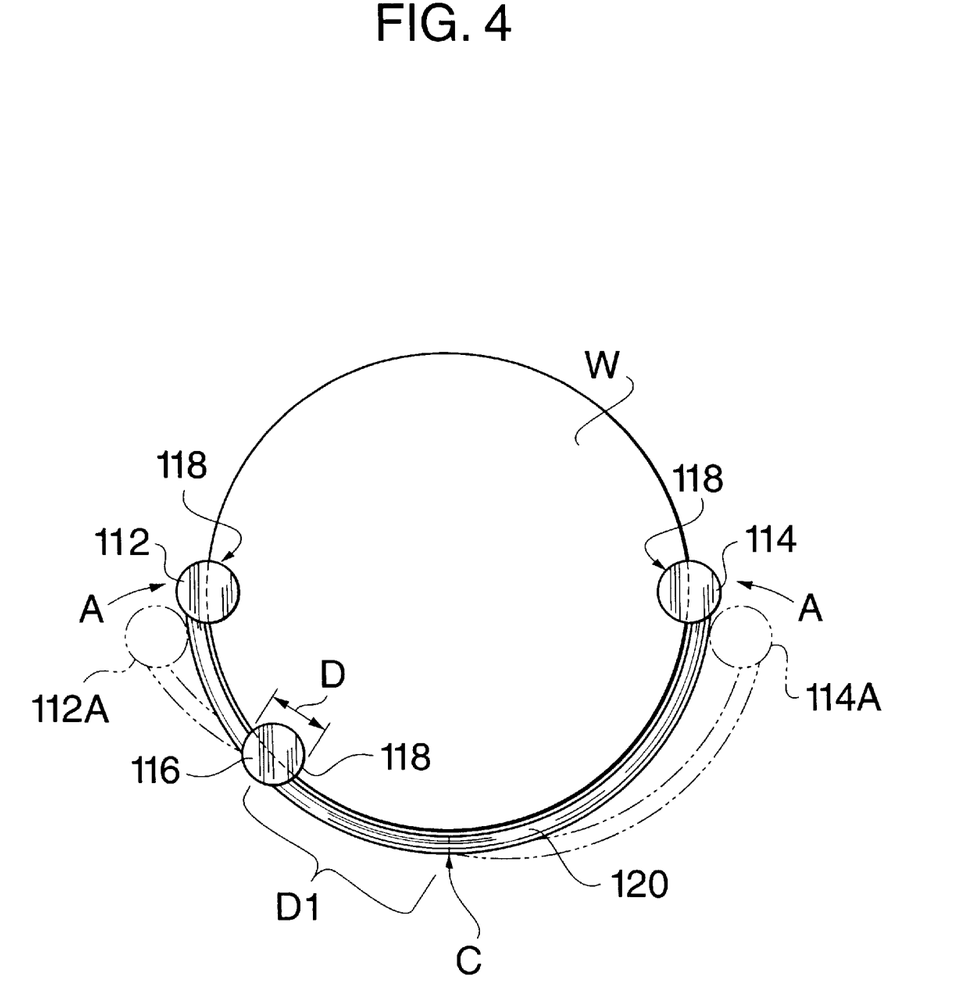
FIG. 4 is a front view of a three point wafer carrier constructed in accordance with the present invention.

FIGS. 3 and 4 illustrate a three point carrier 100 used in the processing of semiconductor substrates, used in the fabrication of semiconductor devices, constructed in accordance with the present invention. A typical example of such a semiconductor substrate is a semiconductor wafer. For purposes of illustration only, the present invention will be described using a semiconductor wafer as the semiconductor substrate. The carrier 100 includes first, second and third side rails 112, 114, 116. The first and second side rails 112, 114, are positioned in a spaced parallel relation by U-shaped or V-shaped supports 120. Although three supports 120 are illustrated, any number of supports 120, or only supports 120 on the ends, may be included in the carrier 100 to provide proper support. It must also be noted that the supports 120 may be curved, angled, straight or any other shape and are not to be limited to the U-shaped supports illustrated in the figures.

The third side rail 116 is positioned on the supports 120 at a point that is closer to the first side rail 114 and not at the lowest or centralized position of the supports 120 as in the conventional carrier (FIGS. 1 and 2). It must be noted that third side rail 116 could also be positioned at a point that is closer to the second side rail 114. The three rails 112, 114, 116 define a wafer receiving portion 130 where the wafers W are to be placed. Each of the rails 112, 114, 116 are provided with a series of equally spaced slots 118, sized and aligned to support a plurality of wafers W in a spaced, parallel relation. Although only two slots 118 are illustrated, the series of slots 118 extend to the ends of the rails 112, 114, 116. The pitch of the slots 118 will be described below in more detail. Any wafers W placed within the slots 118 will have three points of contact with the carrier 10.

Unlike the conventional wafer carrier 10 (illustrated in FIGS. 1 and 2), the carrier 100 of the present invention utilizes a third side rail that is placed on the supports 120 at an off center position relative to the first two side rails 112, 114. The centralized position of the conventional wafer carrier 10 is illustrated by the arrow C. By placing the third side rail 116 in an off center position, etchants will properly drain from the wafers W and out of the rails 112, 114, 116. Thus, etchants are prevented from collecting within the rails 112, 114, 116 of the carrier 100 ensuring proper etching and drying of the semiconductor wafers W.

Preferably, the third side rail 116 is positioned off center by a distance D1 (the distance between the center point C of the supports 120 and the center of the rail 116) equivalent to three times the diameter D2 of the rail 116. That is, the third side rail 116 will be placed on the support 120 three times the diameter D2 of the rail 116 from the center position illustrated by arrow C. It must be noted, however, that the distance D1 from the center position C may vary and may be larger or smaller than the preferred distance as long as any etchant or acid applied during the etching process may properly drain from the wafers W and out of the rail 116.

Similar to the conventional carrier 10 (FIG. 1), the supports 120 are made out of a flexible material, such as TEFLON. In addition, the supports 120 can be made out of other materials, including but not limited to quartz, silicon carbide (SiC), perfluoralkoxy resin (PFA), polytetrafluoroethylene (PTFE) and tetrafluoro copolymers (TFM). The carrier 100 is designed such that when wafers W are placed within the carrier 100, the weight of the wafers W applied onto the third side rail 116 causes the supports 120 to move in the direction illustrated by the arrow A. As the supports 120 move, the first and second side rails 112, 114 also move (the original positions of the rails 112, 114 are illustrated in phantom as reference numerals 112a, 114a) producing a tension proportional to the total weight of all of the wafers W within the carrier 100. The tension maintains the wafers W in place within the wafer carrier 100. The carrier 100 is placed into a semiconductor processor where, for example, wet etching of the wafers W occurs.

Figure 5:
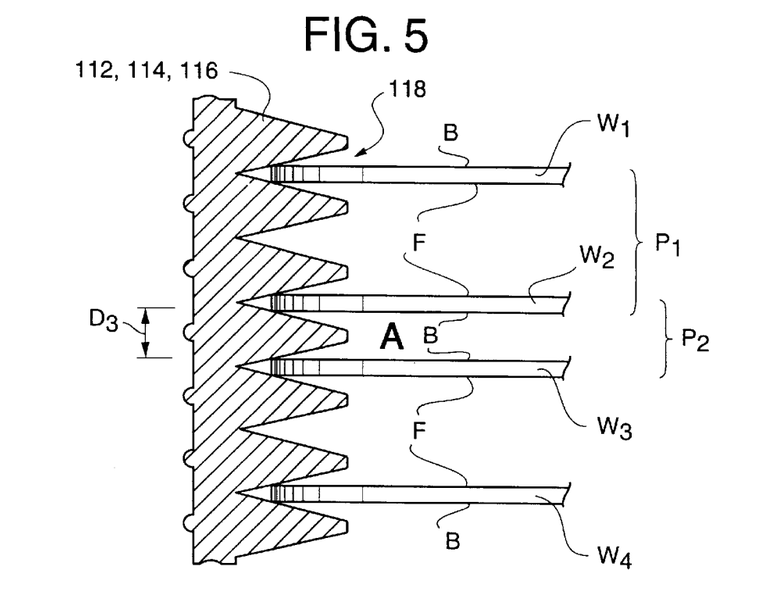
FIG. 5 illustrates an exemplary configuration of the slots provided in the rails of the wafer carrier constructed in accordance with the present invention.

FIG. 5 illustrates one arrangement of the slots 118 that are provided in the three rails 112, 114, 116. As stated above, the slots 118 are spaced along the length of the rails 112, 114, 116, but only an exemplary number of slots 118 are illustrated. Four wafers W1, W2, W3, W4 (collectively referred to as wafers W) are also illustrated. Each wafer W has a front surface F and a back surface B. Each slot 118 is designed to receive a wafer W and the slots 118 are spaced a distance D3 from adjacent slots 118. Wafers W may be placed in every slot 118, every other slot or in any other possible combination of slots. Preferably, the wafers W are placed in the slots 118 such that a front surface F of one wafer W faces a front surface F of an immediately adjacent wafer W (e.g., wafers W1 and W2). Likewise, the wafers are also arranged such that a back surface B of a wafer W faces a back surface B of an immediately adjacent wafer W (e.g., wafers W2 and W3). Preferably, empty slots 118 are used to provide spacing between pairs P1, P2 of adjacent wafers to increase the exposure of the front surface F to the etchant or other semiconductor processing chemicals since in most semiconductor processes, it is desired to provide a complete etching of the front surfaces F of the wafers W while the processing of the backsides of the wafers is typically of no concern.

Figure 6:
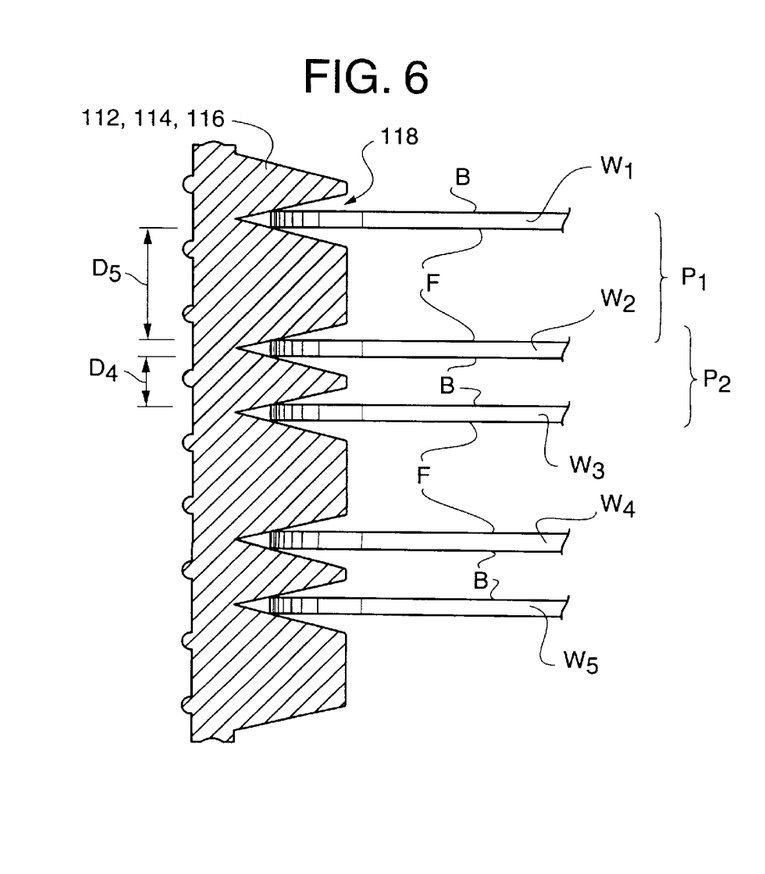
FIG. 6 illustrates another exemplary configuration of the slots provided in the rails of the wafer carrier constructed in accordance with the present invention.

FIG. 6 illustrates a second arrangement of the slots 118 that are provided in the three rails 112, 114, 116. As stated above, the slots 118 are spaced along the length of the rails 112, 114, 116, but only an exemplary number of slots 118 are illustrated. Five wafers W1, W2, W3, W4, W5 (collectively referred to as wafers W) are also illustrated. Each wafer W has a front surface F and a back surface B. Each slot 118 is designed to receive a wafer W. Each slot 118 is spaced a first distance D4 from one adjacent slot 118 and a second larger distance D5 from a second adjacent slot 118. The use of the larger distance D5 between slots 118 removes the necessity of having empty slots 118 between pairs P1, P2 of wafers W. Wafers W may be placed in every slot 118, every other slot or in any other possible combination of slots. Preferably, the wafers W are placed in the slots 118 such that a front surface F of one wafer W faces a front surface F of an immediately adjacent wafer W (e.g., wafers W1 and W2). Likewise, the wafers are also arranged such that a back surface B of a wafer W faces a back surface B of an immediately adjacent wafer W (e.g., wafers W2 and W3). The larger distance D5 between pairs P1, P2 of wafers W is used to increase the exposure of the front surface F to the etchant or other semiconductor processing chemicals since in most semiconductor processes, it is desired to provide a complete etching of the front surfaces F of the wafers W while the processing of the backsides of the wafers is typically of no concern.

Figure 7:
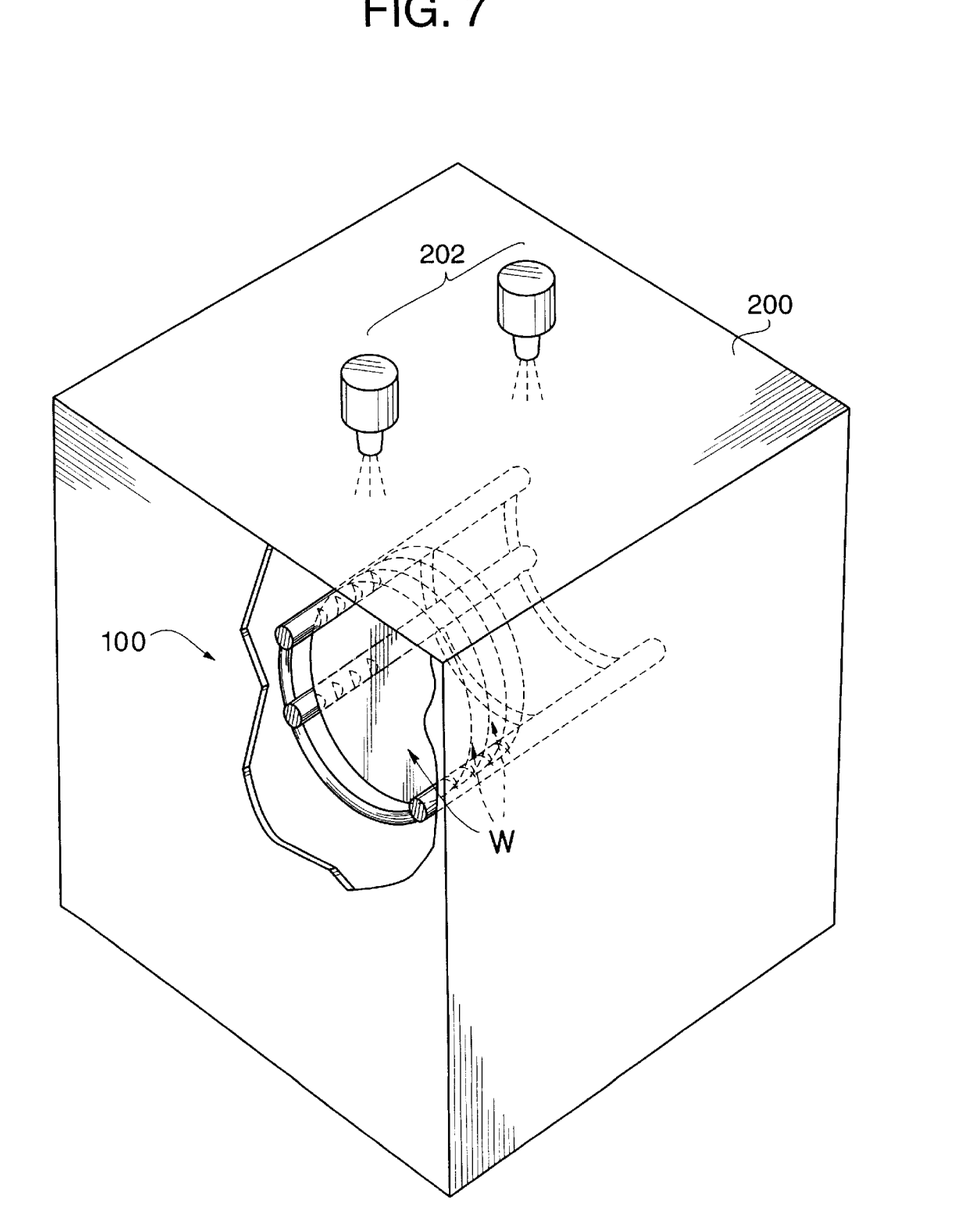
FIG. 7 is an isometric view of the wafer carrier constructed in accordance with the present invention being used in a semiconductor processor.

FIG. 7 illustrates a wafer carrier 100 constructed in accordance with the present invention in use within a semiconductor processor 200. The illustrated carrier 100 includes a plurality of semiconductor wafers W. Preferably, the semiconductor processor 200 is configured to provide wet etching processing of the wafers W contained within the carrier 100.

The processor 200 includes nozzles 202 configured to spray processing chemicals (liquid or gas) toward the wafer carrier 100 and the wafers W therein. The arrangement of the wafers W within the carrier 100 as described above with reference to FIGS. 5 and 6 facilitate the coverage of the fluids across the entire front surfaces of the respective semiconductor wafers W.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by letters patent of the United States is:

1. A semiconductor substrate carrier for wet processing semiconductor substrates, comprising:

first, second and third rails, each of said rails having a plurality of slots for receiving peripheral edges of a semiconductor substrate, said plurality of slots being arranged such that each slot on a rail that is adjacent to two other slots on a same rail is spaced one distance from a first adjacent slot and a second different distance from a second adjacent slot on the same rail; and a plurality of supports for supporting said rails to define therewith said semiconductor substrate carrier, each of said plurality of supports having first and second end portions, said first and second rails being coupled to said first and second end portions of each of said plurality of supports and positioned in a spaced parallel relationship with each other, said third rail being coupled to said supports at a point which is not equidistant from said first and second end portions such that said third rail is off center from a lowest point of said substrate carrier.

2. The carrier of claim 1 wherein said third rail has a diameter and is positioned at a distance that is at least three times its diameter from said lowest point of said substrate carrier.

3. The carrier of claim 1 wherein said third rail has a diameter and is positioned at a distance that is three times its diameter from said lowest point of said substrate carrier.

4. The carrier of claim 1 wherein there are three supports.

5. The carrier of claim 1 wherein said plurality of supports are made from flexible material.

6. The carrier of claim 5 wherein said plurality of supports are made from TEFLON.

7. The carrier of claim 1 wherein said plurality of supports are made from quartz.

8. The carrier of claim 1 wherein said plurality of supports are made from silicon carbide.

9. The carrier of claim 1 wherein said plurality of supports are made from a perfluoralkoxy resin.

10. The carrier of claim 1 wherein said plurality of supports are made from polytetrafluoroethylene.

11. The carrier of claim 1 wherein said plurality of supports are made from tetrafluoro copolymers.

12. The carrier of claim 1 wherein each of said plurality of supports is U-shaped.

13. The carrier of claim 1 wherein each of said plurality of supports is V-shaped.

14. A system for wet processing a semiconductor wafer comprising:

a semiconductor wafer processor; and a semiconductor wafer carrier, said carrier comprising:
first, second and third rails, each of said rails having a plurality of slots for receiving peripheral edges of a semiconductor wafer, said plurality of slots being arranged such that each slot on a rail that is adjacent to two other slots on a same rail is spaced one distance from a first adjacent slot and a second different distance from a second adjacent slot on the same rail; and a plurality of supports for supporting said rails to define therewith said semiconductor wafer carrier, each of said plurality of supports having first and second end portions, said first and second rails being coupled to said first and second end portions of each of said plurality of supports and positioned in a spaced parallel relationship with each other, said third rail being coupled to said supports at a point which is not equidistant from said first and second end portions such that said third rail is off center from a lowest point of said wafer carrier.

15. The system of claim 14 wherein said third rail has a diameter and is positioned at a distance that is at least three times its diameter from said lowest point of said wafer carrier.

16. The system of claim 14 wherein said third rail has a diameter and is positioned at a distance that is three times its diameter from said lowest point of said wafer carrier.

17. The system of claim 14 wherein there are three supports.

18. The system of claim 14 wherein said plurality of supports are made from flexible material.

19. The system of claim 18 wherein said plurality of supports are made from TEFLON.

20. The system of claim 14 wherein said plurality of supports are made from quartz.

21. The system of claim 14 wherein said plurality of supports are made from silicon carbide.

22. The system of claim 14 wherein said plurality of supports are made from a perfluoralkoxy resin.

23. The system of claim 14 wherein said plurality of supports are made from polytetrafluoroethylene.

24. The system of claim 14 wherein said plurality of supports are made from tetrafluoro copolymers.

25. The system of claim 14 wherein each of said plurality of supports is U-shaped.

26. The system of claim 14 wherein each of said plurality of supports is V-shaped.

27. A method of manufacturing a semiconductor substrate carrier, said method comprising:

providing first, second and third rails, each of said rails having a plurality of slots for receiving peripheral edges of a semiconductor substrate, said plurality of slots being arranged such that each slot on a rail that is adjacent to two other slots on a same rail is spaced one distance from a first adjacent slot and a second different distance from a second adjacent slot on the same rail; and connecting a plurality of supports to support said rails to define therewith said semiconductor substrate carrier, each of said plurality of supports having first and second end portions, said first and second rails being coupled to said first and second end portions of each of said plurality of supports and positioned in a spaced parallel relationship with each other, said third rail being coupled to said supports at a point which is not equidistant from said first and second end portions such that said third rail is off center from a lowest point of said substrate carrier.

28. The method of claim 27 wherein said third rail has a diameter and is positioned at a distance that is at least three times its diameter from said lowest point of said substrate carrier.

29. The method of claim 27 wherein said third rail has a diameter and is positioned at a distance that is three times its diameter from said lowest point of said substrate carrier.

30. The method of claim 27 wherein there are three supports.

31. A method of wet processing a semiconductor wafer comprising:

providing three point semiconductor wafer carrier comprising two side rails positioned in a spaced parallel relation by a plurality of supports and a third side rail placed on the supports at an off center position relative to the first two side rails, each of the rails having a plurality of slots for receiving peripheral edges of a semiconductor wafer, the plurality of slots being arranged such that each slot on a rail that is adjacent to two other slots on a same rail is spaced one distance from a first adjacent slot and a second different distance from a second adjacent slot on the same rail;

placing semiconductor wafers within said carrier, said wafers have a front surface to be fully processed and a back surface opposite said front surface which may be partially processed, said wafers being placed within said carrier such that at least one pair of immediately adjacent wafers have their front surfaces facing one another and at least one other pair of immediately adjacent wafers have their back surfaces facing one another;

placing said carrier within a semiconductor substrate processing vessel; and subjecting said wafers to a semiconductor substrate processing in said vessel.

32. The method of claim 31 further comprising the step of drying said wafers within said carrier.

33. The method according to claim 31 further comprising the steps of:

spacing the wafers comprising one pair of wafers on said carrier a first distance; and spacing the wafers comprising another pair of wafers on said carrier a second distance.

* * * * *